(12) United States Patent
Chang et al.

(10) Patent No.: US 6,434,724 B1
(45) Date of Patent: Aug. 13, 2002

(54) METHOD FOR EXTRACTING INDUCTANCE PARAMETERS FROM A CIRCUIT DESIGN

(75) Inventors: Norman H. Chang, Fremont; Shen Lin, Foster City; O. Samual Nakagawa, Redwood City, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/531,093

(22) Filed: Mar. 18, 2000

(51) Int. Cl.$^7$ ............................................. G06F 17/50
(52) U.S. Cl. ................................... 716/4; 716/5; 716/6
(58) Field of Search ........................ 716/1–21; 703/13, 703/14; 438/668

(56) References Cited

U.S. PATENT DOCUMENTS 5,502,644 A * 3/1996 Hamilton et al. ............... 716/5
6,175,947 B1 * 1/2001 Pannapalli et al. ............ 716/5

* cited by examiner

*Primary Examiner*—Matthew Smith
*Assistant Examiner*—Naum Levin

(57) ABSTRACT

A method of operating a data processing system to estimate the inductance values associated with a first metal trace having a defined width, thickness, and length in an integrated circuit. In the present invention, the number and location of any ground planes that are adjacent to the first trace in the integrated circuit are first determined. A first current loop passing through the first trace that depends on the number and location of the ground planes, if any, is defined. The magnetic flux per unit area generated in the first current loop when a predetermined current passes through the first trace is then determined and used to estimate the self-inductance of the first trace. If the first trace is adjacent to any ground planes, current loops through the first trace and the ground planes are also defined. The mutual inductance of the first trace and a second trace parallel thereto is determined by defining a current loop that passes through the first and second traces and determining the magnetic flux per unit area generated in the current loop when a predetermined current flows through the first trace. If the first trace and the second trace are adjacent to ground planes, additional current loops passing through each ground plane and one of the first and second traces are also defined. The invention reduces the computational workload inherent in extracting inductance by substituting N two-trace problems for the general problem involving N parallel traces.

7 Claims, 8 Drawing Sheets

METHOD FOR EXTRACTING INDUCTANCE PARAMETERS FROM A CIRCUIT DESIGN

FIELD OF THE INVENTION

The present invention relates to circuit simulators, and more particularly, to a method for extracting the inductance parameters for the various conductors in the metal layers of an integrated circuit.

BACKGROUND OF THE INVENTION

Integrated circuits typically consist of a number of components fabricated in a semiconductor substrate that are connected by metal lines that are deposited in one or more layers over the semiconductor substrate. Each interconnect layer typically includes conductors that are parallel to one another or a conducting plane, such as a ground plane. The various interconnect layers and the semiconductor substrate are separated from one another by dielectric layers such as $SiO_2$.

The delays and crosstalk introduced by the conductors in the metal layers can become bottlenecks, which limit overall circuit performance. Accordingly, the optimization of the on-chip interconnects is a goal of various simulation and optimization programs. To simulate and optimize on-chip interconnects, the parasitic parameters (resistance, capacitance and inductance) need to be extracted from the interconnect geometry. This extraction must be accurate, as a correlation with "final" verification engines is needed for design convergence. In addition, the extraction must also be efficient, because it may be performed dozens of times at the full-chip level and thousands of times on critical circuit paths.

To simplify the computations, prior art systems have ignored the inductive contributions and relied on the extraction of resistance and capacitance values. However, the increasingly wider and longer wire traces, faster clock frequencies and shorter rising times, utilized in modern circuits require that the inductance effects of on-chip interconnects must be included in the optimization calculations. However, no inductance extraction methodology, which is accurate and efficient for iterative simulation and optimization purposes, has been provided.

Unlike the estimation of parasitic capacitance, the mutual inductance between parallel conductors is not significantly diminished by the presence of additional conductors between the two conductors of interest. The capacitive effect, in contrast, is a "short-range" effect in the sense that for a block of parallel traces, only the mutual capacitance between adjacent traces are important, and the rest of the mutual capacitance can be ignored. Hence, the estimation of the inductive parameters is far more complicated than the estimation of the parasitic capacitances. In effect, mutual inductance must be computed for each pair of parallel conductors in the circuit that are not shielded from one another by a ground plane or the like.

Broadly, it is the object of the present invention to provide an improved method for extracting the parasitic inductive parameters for the metal interconnect layers of an integrated circuit.

It is a further object of the present invention to provide a method for extracting these parameters that is computationally efficient.

These and other objects of the present invention will become apparent to those skilled in the art from the following detailed description of the invention and the accompanying drawings.

SUMMARY OF THE INVENTION

The present invention is a method of operating a data processing system to estimate the inductance values associated with a first metal trace having a defined width, thickness, and length in an integrated circuit having a plurality of metal traces for carrying signals. In the present invention, the number and location of any ground planes adjacent to the first trace in the integrated circuit are first determined. A first current loop passing through the first trace that depends on the number and location of the ground planes, if any, is defined. The magnetic flux per unit area generated in the first current loop when a predetermined current passes through the first trace is then determined and used to estimate the self-inductance of the first trace. The flux depends on the width, thickness, and length of the trace, but is independent of the size and location of the other signal carrying traces in the integrated circuit. If the first trace overlies a first ground plane, the first current loop also passes through the first ground plane and depends on the distance between the first trace and the first ground plane. If the first trace also underlies a second ground plane, a second current loop is defined. The second current loop passes through the first conductor and the second ground plane. In this case, the determined flux also depends of the distance between the first trace and the second ground plane. The mutual inductance of the first trace and a second trace parallel thereto is determined by defining a current loop that passes through the first and second traces and determining the magnetic flux per unit area generated in the current loop when a predetermined current flows through the first trace. The determined flux depends on the distance between the first trace and the second trace, on the width, height, and length of the second trace, and on the distances to any ground planes, but is independent of the size and location of the other signal carrying traces in the integrated circuit. If the first trace and the second trace overlie a first ground plane, additional current loops passing through the ground plane and the first and second traces are also defined. Similarly, if the first and second trace also underlie a second ground plane, two additional current loops are defined, each passing through the second ground plane and one of the traces. The invention reduces the computational workload inherent in extracting inductance by substituting N two-trace problems for the general problem involving N parallel traces.

DETAILED DESCRIPTION OF THE INVENTION

Figure 1:
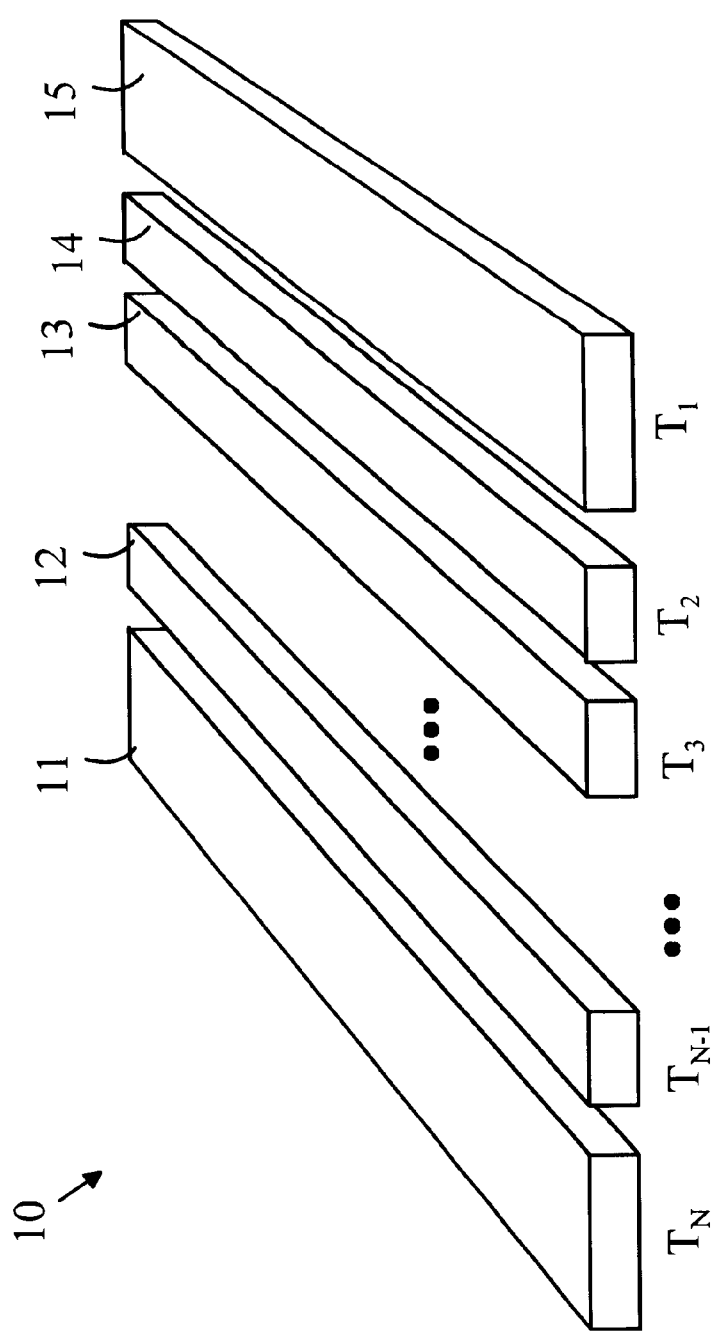
FIG. 1 is a perspective view of a block of traces in one wiring layer.

The manner in which the present invention provides its advantages may be more easily understood with respect to the extraction of the parasitic inductances for conductors that are arranged in the typical manner utilized in VLSI technology. In general, there are multiple metal layers in a VLSI technology, and the wire traces in adjacent layers are orthogonal to one another. Consider a block of N traces as shown in FIG. 1 at 10. FIG. 1 is a perspective view of a block of traces in one wiring layer. The N traces are labeled $T_1, \ldots, T_N$. Exemplary traces are shown at 11–15. In general, the two most outside traces, $T_1$ and $T_N$, are dedicated power or ground traces. When N is three, the block of traces forms a coplanar-waveguide, which is one of the three basic forms for transmission line, and is often used for "clock trees" in high-speed designs. When N is large, the block forms a structure analogous to a bus structure with outside power or ground traces that can be used for shielding and/or power supply lines. In general, the traces will have the same thickness, since the traces are constructed from the same layer of conducting material. Hence, the traces can be described by the width of each trace, $W_1, W_2, \ldots,$ and $W_N$, the spacings, $S_1, S_2, \ldots, S_N$, between the traces, and the length of the traces.

Figure 2:
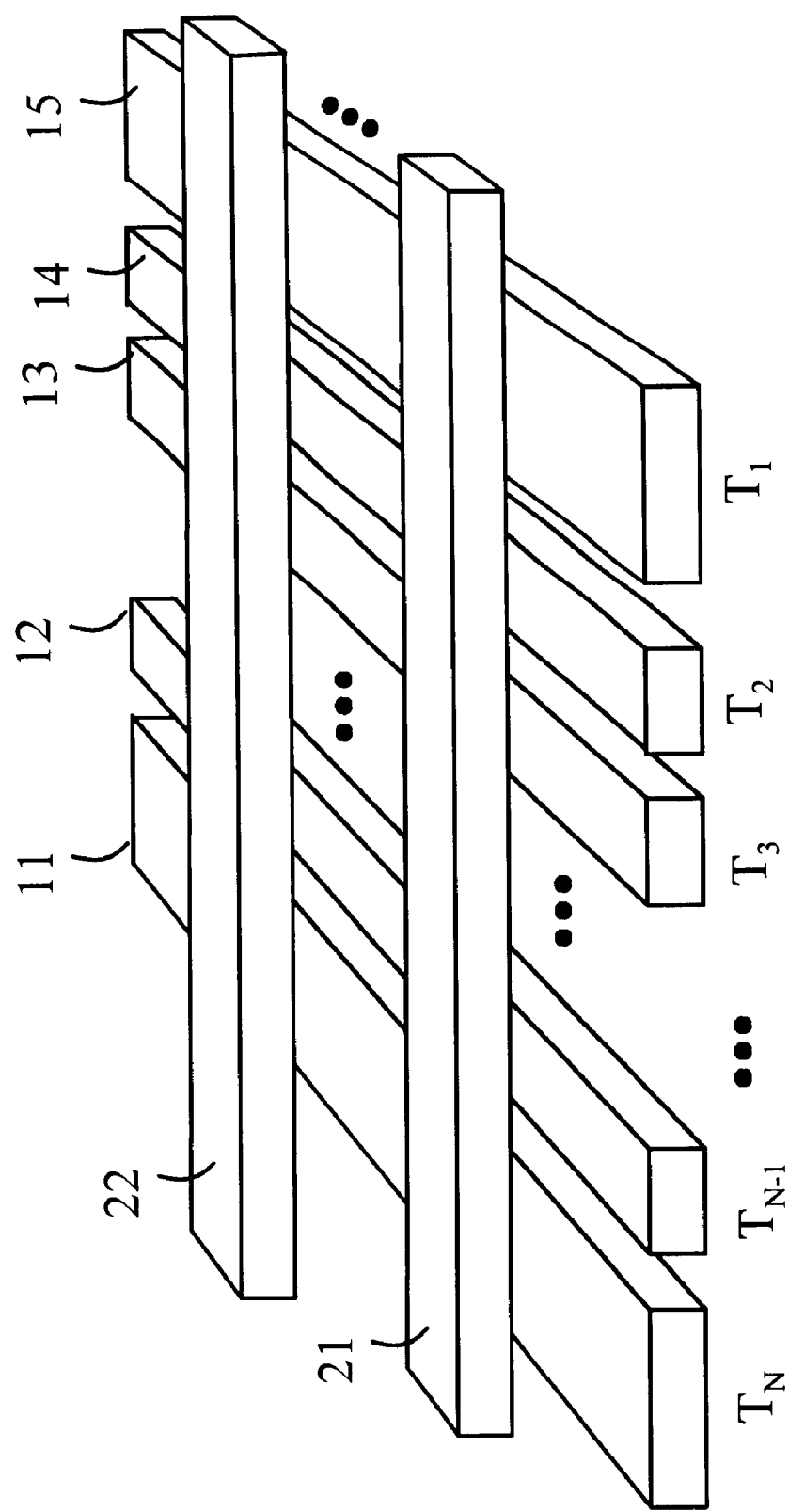
FIG. 2 is a perspective view of the layer of traces shown in FIG. 1 together with exemplary traces 21 and 22 from one of the adjacent layers.

The goal of the present invention is to construct a matrix, $L_{ij}$ whose entries are the mutual inductance between conductors i and j if i≠j and the self inductance of trace i if i=j. As noted above, the inductive coupling is a long range effect; hence, $L_{ij}$ will, in general, have significant entries at all positions in the matrix. The present invention is based on the observation that the self-inductance $L_{i,i}$ of a trace is solely dependent on the physical properties of the trace, i.e., its length, width and thickness. And, the mutual inductance of two traces, $L_{ij}$ is solely determined by the physical properties of those two traces independent of the number of other traces that lie between the traces in question. It should also be noted that the traces on the adjacent layers are orthogonal to one another as shown in FIG. 2, which is a prospective view of the layer of traces shown in FIG. 1 together with exemplary traces 21 and 22 from one of the adjacent layers. Since the traces are orthogonal in the adjacent layers, traces in layer M+1 and layer M−1 will not affect the inductance of traces in layer M.

Figure 3:
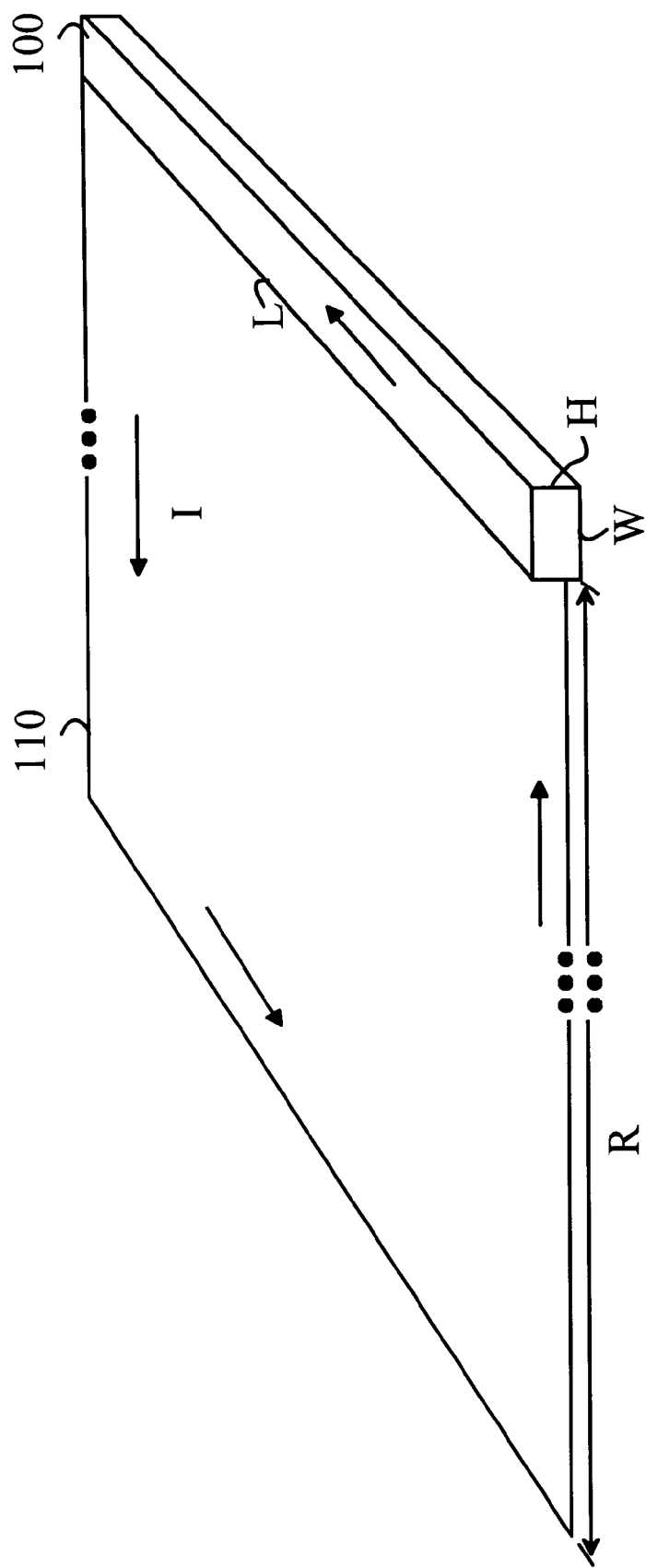
FIG. 3 illustrates the current loop used to compute the self-inductance of a trace 100 that is not adjacent to a ground plane.

The present invention utilizes a number of current loop models for computing the self inductance and mutual inductance values. These models can be more easily understood with reference to FIGS. 3–9. Refer now to FIG. 3, which illustrates the current loop used to compute the self-inductance of a trace 100 that is not adjacent to a ground plane. In this case, a rectangular current loop 110 is constructed with trace 100 as one leg thereof. The partial self-inductance is defined to be the limit of the flux per unit current through loop 110 per unit area of loop 110 as R goes to infinity. The flux for the loop in question can be computed using any commercially available magnetic field computational package, such as FastHenry, which is published by the Mass. Institute of Technology, Cambridge, Mass. or Raphael which is published by Avante, Fremont Calif.

The self-inductance in this case depends only on the physical dimensions of the trace, i.e., the length, width, and height, L, W, and H, respectively, of the trace. In the preferred embodiment of the present invention, a three-dimensional table is constructed having representative values of the self-inductance for various values of L, W, and H within the range of values expected in typical semiconductors. This table is then interpolated to provide the self-inductance value for any particular (L,W,H).

Figure 4:
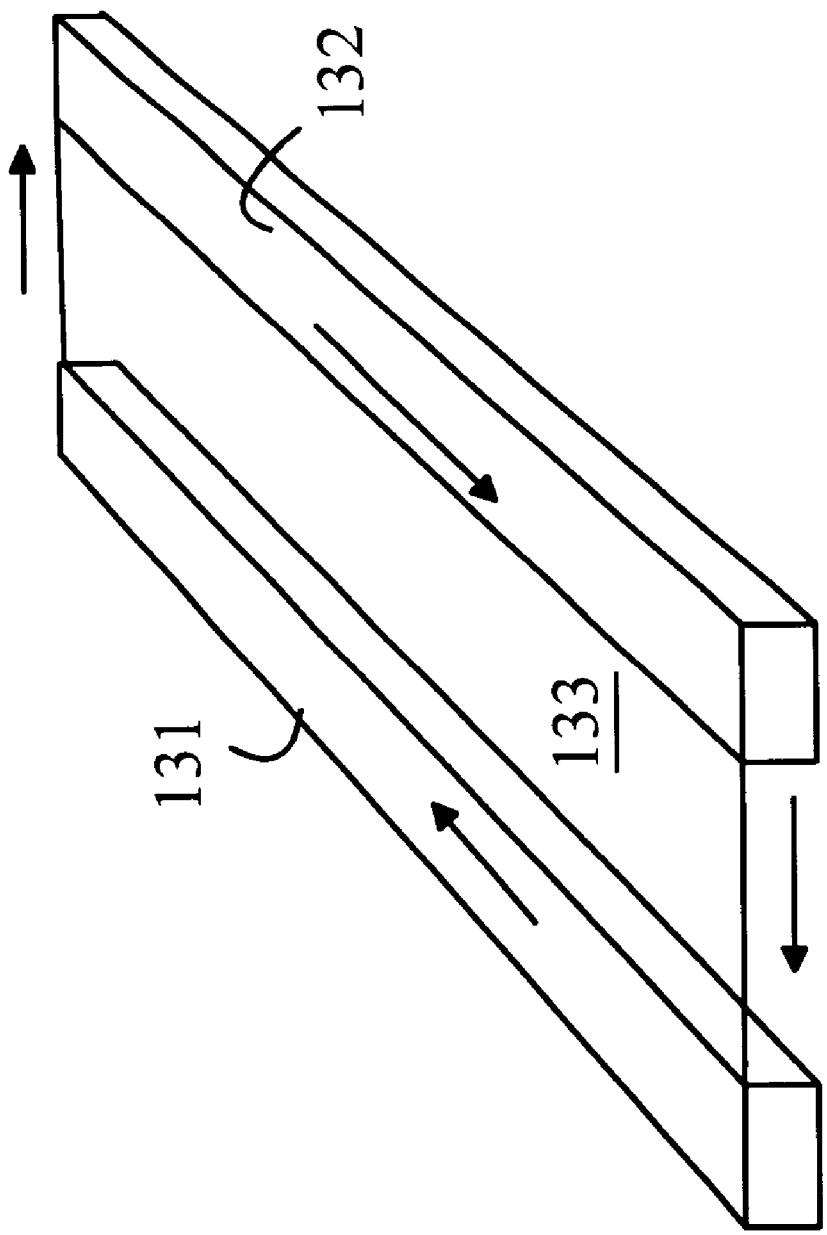
FIG. 4 illustrates the current loop used to compute the mutual inductance of two traces 131 and 132 that are not adjacent to a ground plane.

Refer now to FIG. 4 which illustrates the current loop used to compute the mutual inductance of two traces 131 and 132 that are not adjacent to a ground plane. In this case, the inductance is computed by constructing a current loop 133 having traces 131 and 132 as two legs of the current loop. The mutual inductance is the flux per unit area through loop 133. In general, the mutual inductance depends on 7 parameters, the length, width, and height of each of the traces and the distance between the traces. Hence, a 7-dimensional interpolation table can be utilized to generate the mutual inductance values for any pair of conductors during simulation. However, in practice, the dimensionality of the table can be substantially reduced. For example, the two traces are typically formed by patterning the same metal layer; hence, the height of the two traces is the same. Similarly, for many structures such as buses, the lengths of the two traces are also the same. Hence, only a 5-dimensional table is needed in most practical situations.

Figure 5:
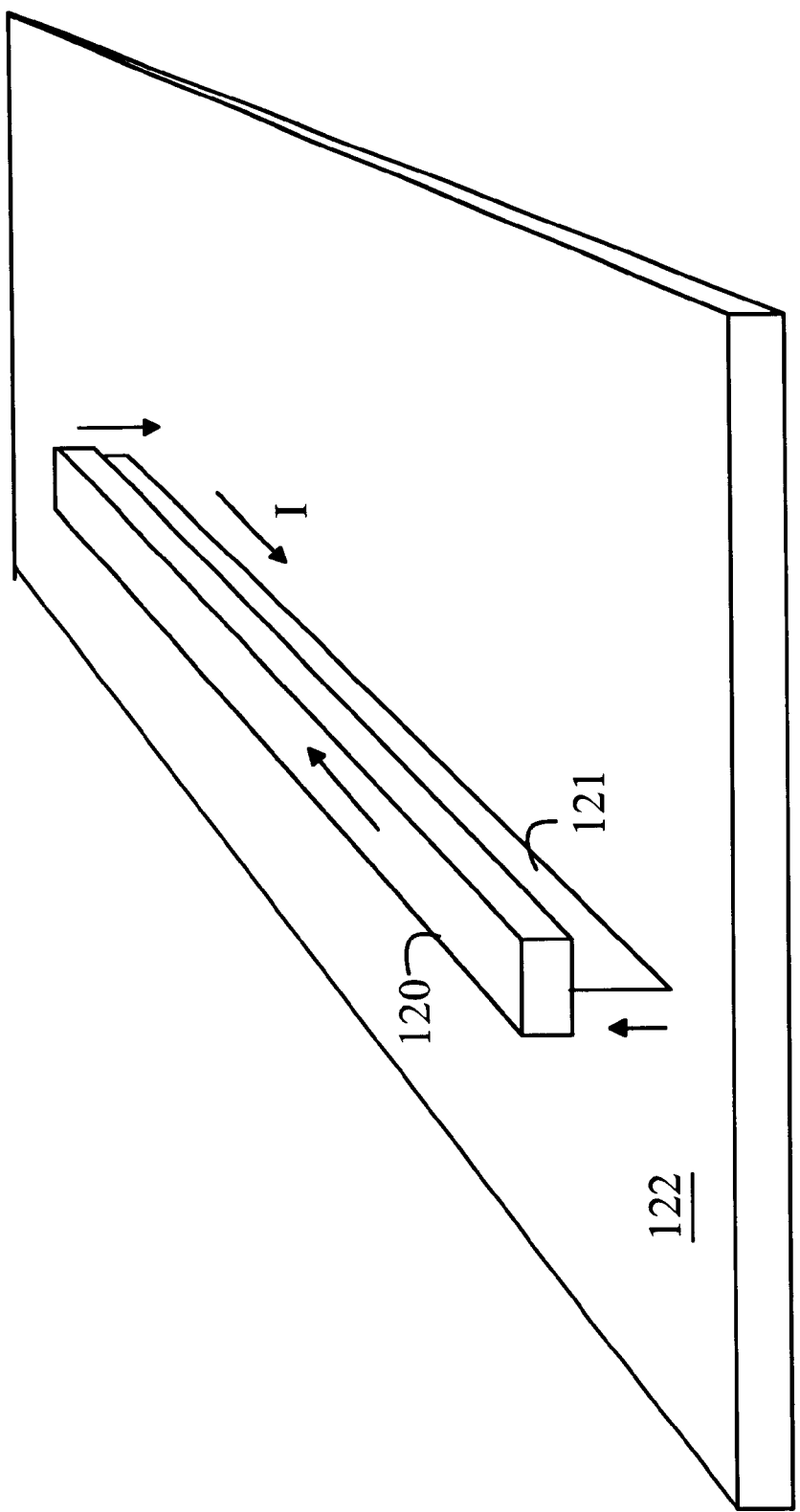
FIG. 5 illustrates the current loop used to compute the self-inductance of a trace 120 over a ground plane 122.

When the conductors are adjacent to ground planes, a different set of models is used to take into account the effects of the ground planes. Refer now to FIG. 5, which illustrates the current loop, used to compute the self-inductance of a trace 120 over a ground plane 122. In this case, the current in the conductor is assumed to return through the ground plane forming a loop 121. The self-inductance is the flux per unit area of loop 121. In this case, a 4-dimensional table is needed to store the self-inductance values, since the self-inductance now depends on the distance between the trace and ground plane in addition to the height, width, and length of the trace.

Figure 6:
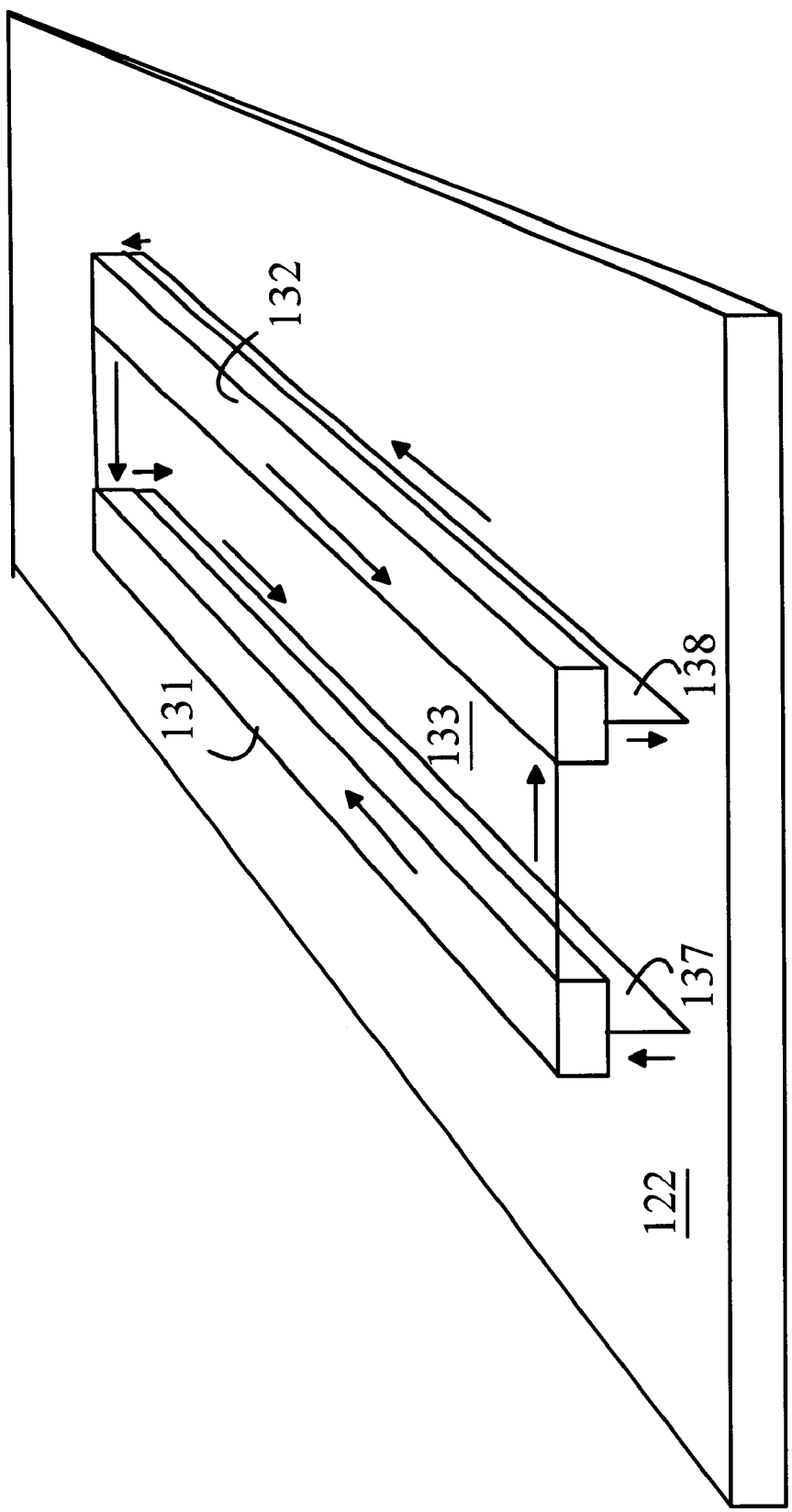
FIG. 6 illustrates the current loops used to compute the mutual inductance of two parallel traces 131 and 132 over a ground plane 122.

Refer now to FIG. 6, which illustrates the current loops used to compute the mutual inductance of two parallel traces 131 and 132 over a ground plane 122. In this case, the model assumes that a portion of the current flowing in each conductor returns via the ground plane as indicated by loops 137 and 138. The mutual inductance is the flux per unit area of loop 133. Hence, the mutual inductance depends, in general, on 9 parameters, the height, width, and length of each of the traces, and the distances between the traces and the ground plane. However, in practice, the distances between the conductors and the ground planes are the same, and the heights of the traces are the same. Accordingly, only a 7-dimensional table is needed.

Figures 7, 8:
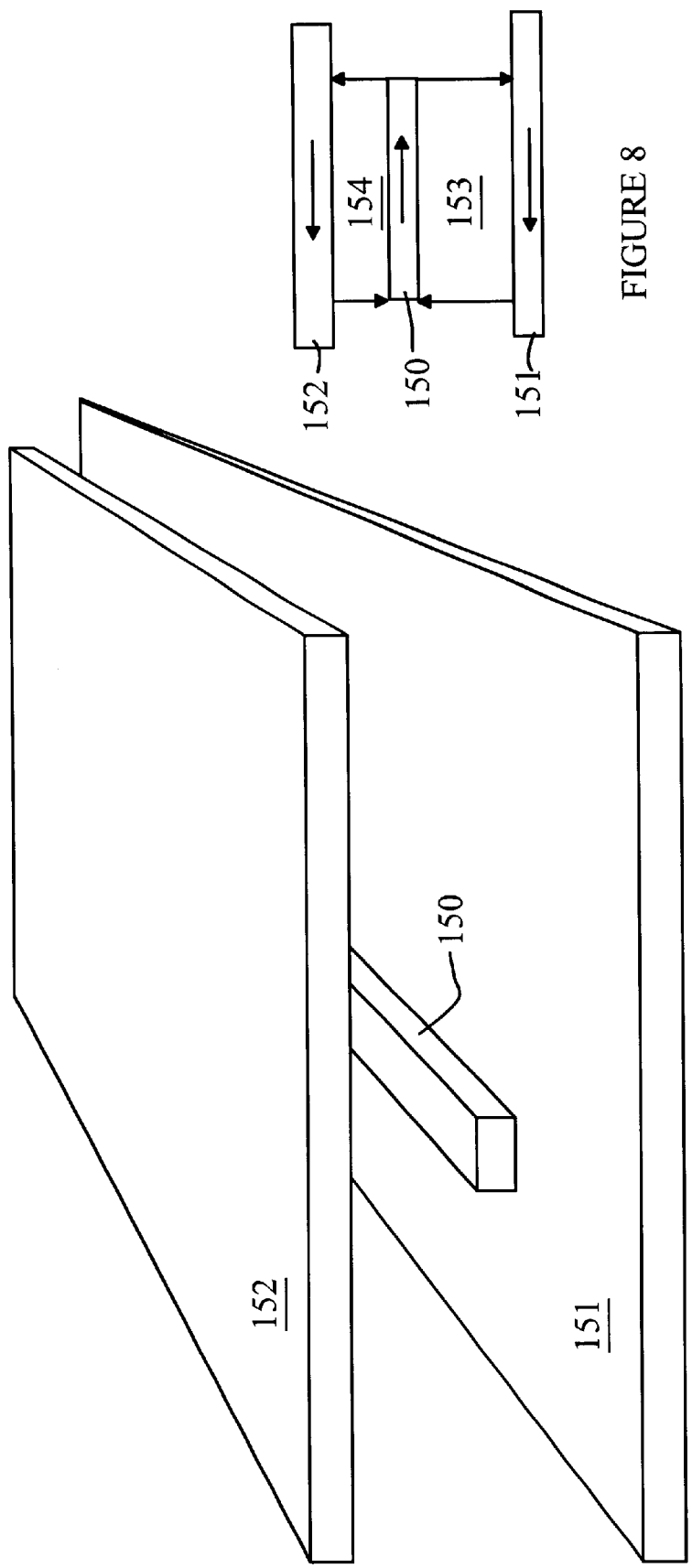
FIG. 7 is a perspective view of a trace 150 sandwiched between two ground planes 151 and 152.
FIG. 8 is an end view of the ground planes and trace shown in FIG. 7.

If the traces are sandwiched between two ground planes, additional current loops through the second ground plane must also be computed. Refer now to FIGS. 7 and 8. FIG. 7 is a prospective view of a trace 150 sandwiched between two ground planes 151 and 152. FIG. 8 is an end view of the ground planes and trace shown in FIG. 7. In this case, the self-inductance of trace 150 is the average flux per unit area in loops 153 and 154. It will be apparent from FIGS. 7 and 8 that the self-inductance in this case depends on 5 parameters, the height, width, and length of the trace and the distances to the two ground planes.

Figure 9:
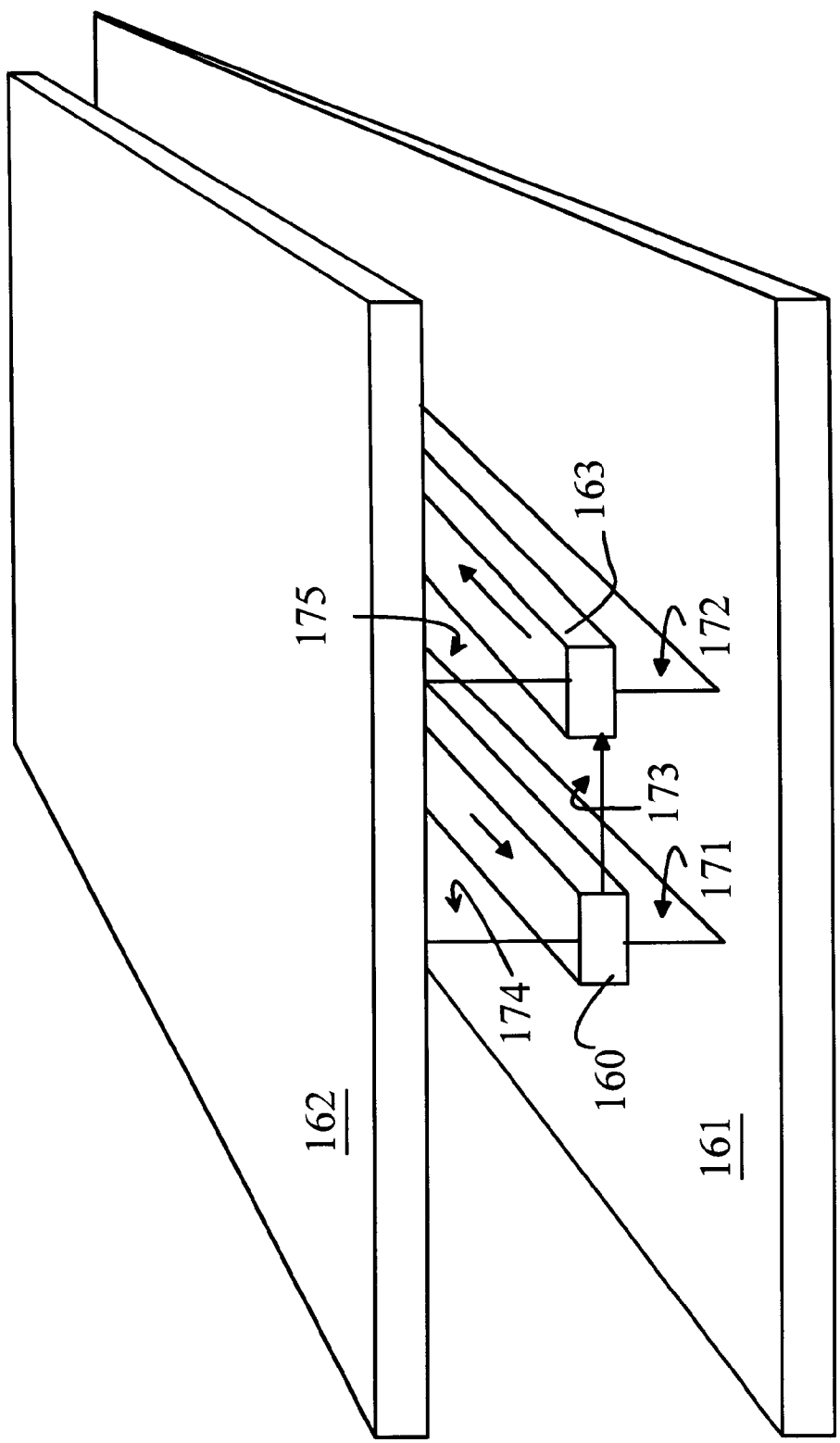
FIG. 9 is a perspective view of two traces 160 and 163 sandwiched between ground planes 161 and 162

The mutual inductance of two traces sandwiched between two ground planes requires that 5 loops be computed. Refer now to FIG. 9, which is a prospective view of two traces 160 and 163 sandwiched between ground planes 161 and 162. Loops 171, 172, and 173 are analogous to the three loops shown in FIG. 9. The additional two loops representing the current return paths in ground plane 162 are shown at 174 and 175. The mutual inductance of the two traces is the flux per unit area in loop 163. It will be apparent from FIG. 9 that the self inductance depends on 11 parameters, i.,e., the 9 parameters discussed above with respect to FIG. 6 and the two additional distances from the traces to the second ground plane.

However, as noted above, in practice, the distances to the second ground plane are the same and the heights of the traces are the same; hence, only an 8-dimensional table is needed.

The results discussed above for traces over a ground plane or sandwiched between two ground planes also hold for slotted ground planes. A slotted ground plane is set of parallel traces in which the individual traces are held at ground or one of the power rails.

As noted above, the preferred embodiment of the present invention utilizes pre-computed tables of the self-inductance and mutual inductances that are interpolated at run-time during simulations to provide the inductance values needed in the simulation. In the preferred embodiment of the present invention, the tables are interpolated using a bi-cubic spline algorithm to interpolate/extrapolate the inductance for a geometry that is not given in the table. However, embodiments in which the inductances are computed via a magnetic field calculating routine during the simulation may also be practiced without departing from the teachings of the present invention.

It should also be noted that the inductances are also a function of the skin depth of the conductors, and hence, are a function of frequency as well. Accordingly, an additional dimension must be calculated if the results are to be applied to simulation at more than one frequency.

It will be apparent to those skilled in the art from the preceding discussion that the present invention provides a substantial reduction in the computational workload needed to compute the inductances of multiple conductors. Consider a layer having N conductors. Absent the present invention, the field generating routine would need to simultaneously solve for all of the current loops on all conductors. This computational problem is of order hours to days of computing time. The present invention reduces this problem to solving N two conductor problems. The computational workload imposed by the two-conductor problems is of order of a second or less.

Various modifications to the present invention will become apparent to those skilled in the art from the foregoing description and accompanying drawings. Accordingly, the present invention is to be limited solely by the scope of the following claims.

What is claimed is:

1. A method of operating a data processing system to estimate the inductance values associated with each of a plurality of metal traces used to conduct signals in an integrated circuit, said method comprising the steps of:

selecting a first one of said metal traces, said trace being characterized by a defined width, thickness, and length in an integrated circuit;

determining the number and location of any ground planes adjacent to said first trace in said integrated circuit; and defining a first current loop passing through said first trace and determining the magnetic flux per unit area generated in said first current loop when a predetermined current passes through said first trace, said flux depending on said width, thickness, and length of said trace and said flux being independent of any others of said metal traces used to conduct signals in said integrated circuit.

2. The method of claim 1 wherein said first trace overlies a first ground plane and wherein said first current loop also passes through said first ground plane, said determined flux also depending on the distance between said first trace and said first ground plane.

3. The method of claim 2 wherein said first trace also underlies a second ground plane and wherein a second current loop is defined, said second current loop passing through said first trace and said second ground plane, said determined flux also depending on the distance between said first trace and said second ground plane.

4. The method of claim 1 further comprising the steps of determining the location of a second one of said traces used to conduct signals in said integrated circuit that is parallel to said first trace; and defining a second current loop passing through said first and second traces and determining the magnetic flux per unit area generated in said second current loop, said determined flux also depending on the distance between said first trace and said second trace and on the width, height, and length of said second trace, said flux being independent of any others of said metal traces used to conduct signals in said integrated circuit.

5. The method of claim 4 wherein said first trace and said second trace overlie a first ground plane and wherein a third current loop is defined, said third current loop passing through said first ground plane and said first trace, and wherein a fourth current loop passing through said first ground plane and said second trace is also defined, said determined flux also depending on the distance from said first trace to said first ground plane and the distance from said second trace to said first ground plane.

6. The method of claim 5 wherein said first trace 160 and said second trace also underlie a second ground plane and wherein a fifth current loop is defined, said fifth current loop passing through said first trace and said second ground plane, and wherein a sixth current loop passing through said second trace and said second ground plane is also defined, said determined flux also depending on the distance between said second trace and said second ground plane.

7. The method of claim 1 wherein said step of determining said flux comprises interpolating a table having pre-computed flux values for a plurality of possible values of said length, width, and height of said first trace.

* * * * *